US009772254B1

(12) United States Patent
Butts

(10) Patent No.: US 9,772,254 B1
(45) Date of Patent: Sep. 26, 2017

(54) SHAKER SYSTEMS WITH CLASS D POWER AMPLIFIERS AND METHODS

(71) Applicant: Gary C. Butts, Huntington Beach, CA (US)

(72) Inventor: Gary C. Butts, Huntington Beach, CA (US)

(73) Assignee: Lus & Butts, LLC, Costa Mesa, CA (US)

( * ) Notice: Subject to any disclaimer, the term of this patent is extended or adjusted under 35 U.S.C. 154(b) by 285 days.

(21) Appl. No.: 14/668,827

(22) Filed: Mar. 25, 2015

(51) Int. Cl.
  G01M 7/00 (2006.01)
  G01N 29/00 (2006.01)
  G01M 7/02 (2006.01)

(52) U.S. Cl.
  CPC .................................. *G01M 7/022* (2013.01)

(58) Field of Classification Search
  CPC ..... G01M 7/022; G01M 7/025; B06B 1/0246; B06B 3/00; B06B 2201/53
  USPC .................................. 73/571, 579, 662, 664
  See application file for complete search history.

(56) References Cited

U.S. PATENT DOCUMENTS 4,700,148 A * 10/1987 Pauly .................... G01M 7/022
  318/128
4,989,158 A * 1/1991 Sloane .................. G01M 7/022
  700/280
5,548,286 A * 8/1996 Craven ................ H03M 1/1038
  332/107
2013/0013241 A1* 1/2013 Sill et al. ............... G01D 18/00
  702/94

OTHER PUBLICATIONS

Authors: Bah-Hwee Gwee, Member, Joseph S. Chang, and Huiyun Li, Title: A Micropower Low-Distortion Digital Pulsewidth Modulator for a Digital Class D Amplifier, Date: Apr. 2002, Publisher: IEEE Transactions on Circuits and Systems—II: Analog and Digital Signal Processing, vol. 49, No. 4, p. 245-256.*

* cited by examiner

*Primary Examiner* — Lisa Caputo
*Assistant Examiner* — Roger Hernandez-Prewitt
(74) *Attorney, Agent, or Firm* — Blakely Sokoloff Taylor & Zafman LLP

(57) ABSTRACT

A shaker test system with a class D power amplifier having an analog to digital converter to receive an analog input signal and convert the analog input signal to a digital signal, pulse width modulation logic coupled to the analog to digital converter to provide a delay time to a delay line to control a transition time of a pulse width modulated signal responsive to an output of the analog to digital converter, and a class D power output stage coupled to the delay line and responsive to the pulse width modulated signal to provide an output of the class D power amplifier stage. The class D amplifier allows use of a low cost microcontroller to obtain very small pulse width increments using a low cost microcontroller to provide a low cost shaker test system incorporating the class D power amplifier.

9 Claims, 2 Drawing Sheets

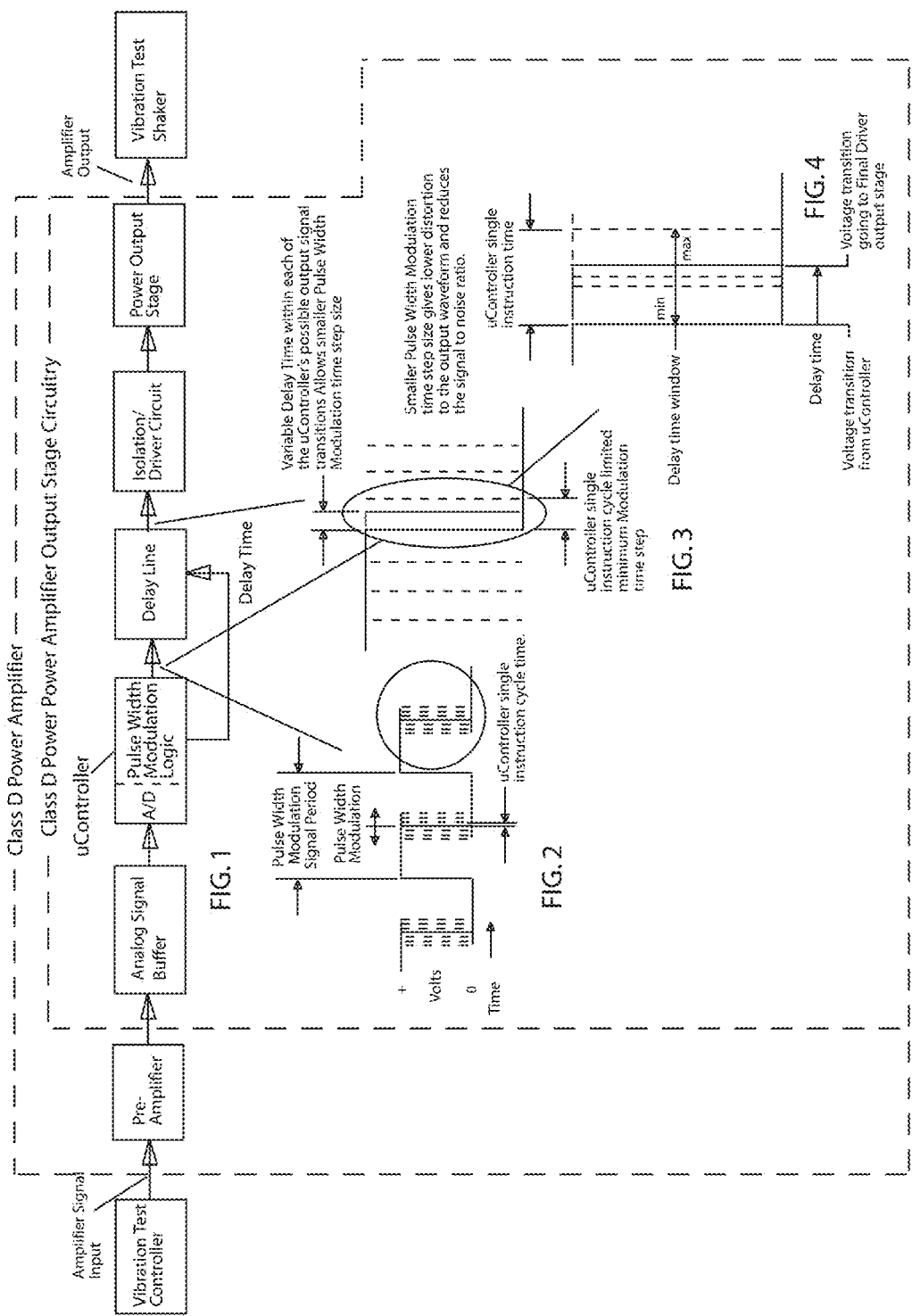

SHAKER SYSTEMS WITH CLASS D POWER AMPLIFIERS AND METHODS

BACKGROUND OF THE INVENTION

1. Field of the Invention

The present invention relates to the field of class D power amplifiers.

2. Prior Art

Microcontrollers have been commonly used for pulse width modulation of low frequency and low dynamic range signals such as are used in motor control. However, the use of Microcontrollers for pulse width modulation of high frequency audio amplifiers has been limited by the basic instruction cycle time of the Microcontroller. In order to establish a digitally generated audio pulse width modulation signal with high frequency capability and high dynamic range, it is necessary for the digital pulse width modulation time steps to be much shorter than common Microcontroller cycle time.

BRIEF DESCRIPTION OF THE DRAWINGS

FIG. 1 is a block diagram of a basic class D amplifier system in Accordance with the present invention.

FIGS. 2-4 illustrate the incremental changes in pulse width of a pulse width modulation pulse using a class D amplifier system in Accordance with the present invention.

DETAILED DESCRIPTION OF THE PREFERRED EMBODIMENTS

Figure 5:
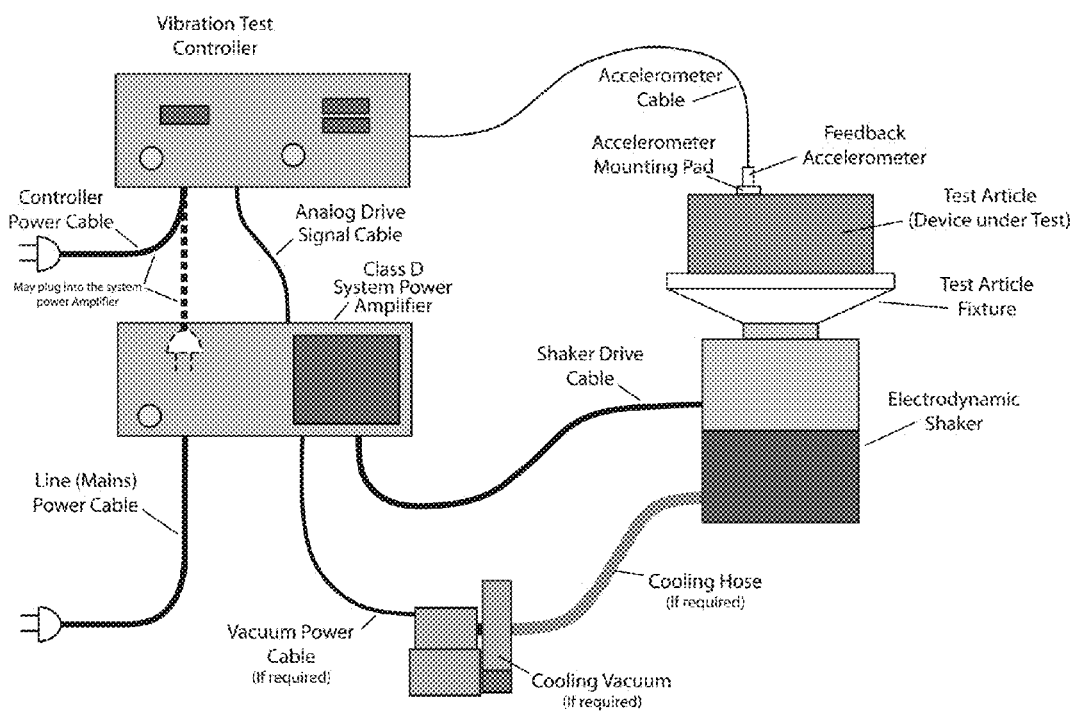
FIG. 5 is a block diagram of an overall vibration test system incorporating the present invention.

The circuits and methods disclosed herein allow the use of a relatively inexpensive Microcontroller to establish the timing signals required for pulse width modulation of high frequency audio amplifiers, allowing the achievement of high dynamic range and signal to noise ratio. In accordance with an embodiment of the invention, rather than use a Microcontroller to directly control the output time resolution, a variable time delay circuit is added having a time delay resolution of the order needed to produce the desired output time resolution. With the delay time being controlled by the Microcontroller operating under program control as pulse width modulation logic3, a circuit can be formed that allows the Microcontroller to generate pulse width modulated signals with extremely fine digital time step increments, even though the Microcontroller itself has a much longer cycle time, thus yielding the necessary signal fidelity for high frequency, high dynamic range, high signal-to-noise audio output signals.

For example, to digitally generate pulse width modulated audio signals up to 7 KHz it is desirable to have the analog signal sampled at a frequency higher than double the highest frequency of interest=14 KHz. Higher sample rates will yield lower distortion, and 44 KHz is often used. In order to allow filtering of a Class D power output stage which allows the desired signal to pass while suppressing the basic switching frequency, it is desirable to have a relatively high basic switching frequency. High power output transistors, FETs, etc. limit this upper frequency. 120 KHz may be used as an example. In order to produce a pulse width modulated signal with 12 bit (72 dB) resolution, the pulse width modulated time steps must be no larger than 1/4096 (1/(2^12)) of the basic switching frequency's period. For this example, the time step resolution will be (1/120 KHz)*(1/4096), or 2 nSec (2e-9 Sec). This time step resolution is 10 to 20 times smaller than the single instruction cycle capability of a typical Microcontroller. In the example above, providing a time delay circuit with 2 nSec digital time resolution and allowing the Microcontroller to program this delay, a Microcontroller controlled pulse width modulated signal can be generated with 2 nSec modulation time steps and a 44 KHz modulation update rate. In that regard, note that the 120 KHz modulation update rate is easily within the capability of a relatively inexpensive Microcontroller, so that the modulation update rate is not the problem, the allowable increments in the pulse width (delay time) is. Note also that "delay time" may be an actual delay in the negative going transition using the convention illustrated in FIGS. 2-4 (to be described) to provide a greater than 50% pulse width, or an advance in the negative going transition to provide a less than 50% pulse width. The delay is from the initiation of a pulse period (a positive transition).

A block diagram of a basic class D amplifier system is shown in FIG. 1. As shown therein, a Signal input is coupled to an analog signal buffer, and from the buffer to a Microcontroller (uController in the Fig.) having an onboard analog to digital converter (A/D). The Microcontroller sets the Delay Time of the Delay Line (programmable), and in the example above, updates that setting at the rate of 120 kHz at the beginning of a pulse, a positive transition in the example. As illustrated in FIG. 2, the repetition rate of the pulses is fixed (120 kHz in the example) but the Delay Time (in clock cycles of 1/(2 nSec) or 500 mHz for the delay line clock) set in the Delay Line determines the timing of the negative transition, and thus the pulse width. As illustrated in FIG. 2, the pulse width is adjustable in 2 nSec increments above and below a 50% pulse width, overcoming the problem that Minimum Modulation time step size is limited by the Microcontroller's instruction cycle time. This result is also illustrated in FIGS. 3 and 4. In a typical power amplifier application, the output of the delay line will be amplified in an Isolation/Driver Circuit for final amplification by a Power Output Stage Circuit to provide the final pulse width modulated Amplifier Output.

In a preferred embodiment, the delay line whose output reflects its input delayed by a programmed time delay is an analog delay line that is programmed by the Microcontroller on the fly as required. Its input is triggered by a logic transition from the Microcontroller providing the initiation of the delay line's logic delay, with the output of the delay line reflecting its input when the programmed delay expires. The Microcontroller, typically having a quartz crystal clock, is programmed to trigger the next pulse after a fixed number of Microcontroller clock cycles, so the period between the triggering successive pulses is highly accurate and repeatable. Of course, other types of delay lines could also be used if desired.

Now referring to FIG. 5, a block diagram of an overall system incorporating the present invention may be seen. The system shown is a typical vibration test system as may be used to test products under development and products in production, typically on a sampling basis, for products for consumer as well as military use. The four major components of the exemplary system are the electrodynamic shaker itself to provide vibratory motion to the test article (device under test) through a test article fixture, a vibration test controller and a system power amplifier, the power amplifier being generally in accordance with FIGS. 1 through 4. In a typical system the vibration test controller will be capable of providing various drive signals through the drive cable to the system power amplifier. Such drive signals may include, by way of example, a fixed frequency drive signal or a drive signal which will sweep through a given frequency range at a commanded rate of change of frequency. The signals, themselves, typically are sine wave signals, though other wave shapes are also sometimes used, such as by way of example, a triangular wave. Whatever the wave form is, that waveform is amplified by the system power amplifier to provide a shaker drive current through the shaker drive cable to drive the electrodynamic shaker. That drive signal, as amplified by the system power amplifier, controls the shaker to provide a corresponding force to the shaker table and the test article thereon. In turn, usually a feedback accelerometer is mounted on the test article or at least on the shaker table to provide an acceleration feedback signal to the vibration test controller to allow corrections in the drive signal to accurately achieve the commanded acceleration.

Shakers are normally designed to be capable of providing the maximum possible acceleration to a test article mounted thereon, and accordingly, can consume large amounts of power, to the extent that such shakers may be provided with augmented cooling, such as is illustrated in FIG. 5. Accordingly, the maximum power output required from the system power amplifier can be very large for the size of the electrodynamic shaker being used, and accordingly, the power amplifier of the present invention is ideally suited for such applications as providing the needed power output in a low noise, relatively low cost power amplifier.

Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A shaker system comprising:
    a vibration test controller;
    a system power amplifier; and
    a shaker;
    the vibration test controller being coupled to the system power amplifier, the system power amplifier being coupled to the shaker;
    the system power amplifier having an analog to digital converter to receive an analog input signal from the vibration test controller and to convert the analog input signal to a digital signal;
    pulse width modulation logic coupled to the analog to digital converter to provide a delay time to a delay line to control a transition time of a pulse width modulated signal responsive to an output of the analog to digital converter; and
    a class D power output stage coupled to the delay line and responsive to the pulse width modulated signal to provide an output of the class D power output stage to the shaker.

2. The shaker system of claim 1 further comprising an accelerometer coupled to the shaker and coupled to the vibration test controller to provide a feedback signal to the vibration test controller.

3. The shaker system of claim 2 wherein the accelerometer is coupled to an article under test as mounted on the shaker.

4. The shaker system of claim 1 wherein the class D power output stage is coupled to the delay line through an isolation/driver circuit.

5. The shaker system of claim 1 wherein the pulse width modulation logic comprises a microcontroller for operation under program control.

6. The shaker system of claim 5 wherein the microcontroller has a cycle time that is greater than an increment in the delay time of the pulse width modulated signal as provided by the delay line.

7. The shaker system of claim 5 wherein the microcontroller includes the analog to digital converter.

8. A method of powering a shaker comprising:
    providing an analog signal responsive to a shaker control input;
    digitizing the analog signal;
    converting the digitized signal to a delay time for a pulse transition to provide a pulse width modulated signal having a pulse duration responsive to the delay time, the digitized signal being converted to the delay time in a microcontroller having an instruction cycle time that is longer than an increment in the delay time, a period of the pulse width modulated signal being equal to or greater than the instruction cycle time of the microcontroller; and
    amplifying the pulse width modulated signal to provide a power output to the shaker.

9. A method of powering a shaker comprising:
    providing an analog signal responsive to a shaker control input;
    in a microcontroller, digitizing the analog signal and converting the digitized signal to a delay time for a pulse transition to provide a pulse width modulated signal having a pulse duration responsive to the delay time, the microcontroller having an instruction cycle time that is longer than an increment in the delay time, the period of the pulse width modulated signal being equal to or greater than the instruction cycle time of the microcontroller; and
    amplifying the pulse width modulated signal to provide a power output to the shaker;
    providing an acceleration feedback signal responsive to acceleration of a table of the shaker or of a test article on the shaker table; and
    adjusting the analog signal responsive to the acceleration feedback signal to achieve an acceleration set by the shaker control input.

* * * * *